United States Patent
Nast et al.

(10) Patent No.: US 11,431,374 B2
(45) Date of Patent: Aug. 30, 2022

(54) METHOD AND APPARATUS FOR AMPLIFYING RADIO SIGNALS BETWEEN A TERMINAL DEVICE AND AN ANTENNA

(71) Applicant: MOLEX CVS DABENDORF GMBH, Dabendorf (DE)

(72) Inventors: Helmut Nast, Berlin (DE); Lars Lehmann, Wildau (DE); Helmut Kautge, Stahnsdorf (DE)

(73) Assignee: Molex CVS Dabendorf GmbH, Zossen (DE)

( * ) Notice: Subject to any disclaimer, the term of this patent is extended or adjusted under 35 U.S.C. 154(b) by 302 days.

(21) Appl. No.: 16/759,735

(22) PCT Filed: Nov. 6, 2018

(86) PCT No.: PCT/EP2018/080300
§ 371 (c)(1),
(2) Date: Apr. 28, 2020

(87) PCT Pub. No.: WO2019/086701
PCT Pub. Date: May 9, 2019

(65) Prior Publication Data
US 2020/0395973 A1 Dec. 17, 2020

(30) Foreign Application Priority Data
Nov. 6, 2017 (DE) .......................... 102017219686.6

(51) Int. Cl.
*H04B 1/48* (2006.01)
*H03F 3/189* (2006.01)
(Continued)

(52) U.S. Cl.
CPC .............. *H04B 1/48* (2013.01); *H03F 3/189* (2013.01); *H03F 3/24* (2013.01); *H04B 1/006* (2013.01);
(Continued)

(58) Field of Classification Search
CPC ........ H04B 1/48; H04B 1/0057; H04B 1/006; H03F 3/189; H03F 3/24; H03F 2200/111; H03F 2200/451
See application file for complete search history.

(56) References Cited

U.S. PATENT DOCUMENTS 6,321,068 B1 * 11/2001 Zamat .................. H04B 17/318
455/69
8,718,578 B2 * 5/2014 Adler ..................... H04B 1/006
455/226.1
(Continued)

FOREIGN PATENT DOCUMENTS

CN 101340178 A 1/2009
CN 103219958 A 7/2013
(Continued)

OTHER PUBLICATIONS

International search report received for PCT application No. PCT/EP2018/080300, dated Dec. 19, 2018, 11 pages. (2 pages of English translation and 9 pages of official copy).
(Continued)

*Primary Examiner* — Janice N Tieu

(57) ABSTRACT

A circuit arrangement for amplifying radio signals between a terminal device and an antenna and to a corresponding circuit arrangement is disclosed. The circuit arrangement has a transmission amplifier path and a reception amplifier path. A signal power in a first frequency range in the transmitting direction is detected to determine a transmitted signal power and a signal power in a second frequency range in the receiving direction is detected to determine a received signal power. The detected transmitted signal power can be compared with the detected received signal power. If the detected transmitted signal power is stronger than the detected received signal power, the transmission amplifier path can amplify transmitted signals in the first frequency
(Continued)

range. If the detected received signal power is stronger than the detected transmitted signal power, the reception amplifier path can amplify received signals in the second frequency range.

13 Claims, 5 Drawing Sheets

(51) Int. Cl.
*H03F 3/24* (2006.01)
*H04B 1/00* (2006.01)

(52) U.S. Cl.
CPC ...... *H04B 1/0057* (2013.01); *H03F 2200/111* (2013.01); *H03F 2200/451* (2013.01)

(56) References Cited

U.S. PATENT DOCUMENTS

| | | | | |
|---|---|---|---|---|
| 2006/0052131 A1* | 3/2006 | Ichihara | ............... | H04B 1/005 455/552.1 |
| 2021/0136691 A1* | 5/2021 | Xu | ............... | H04W 52/52 |

FOREIGN PATENT DOCUMENTS

| | | |
|---|---|---|
| CN | 106357090 A | 1/2017 |
| CN | 107070493 A | 8/2017 |
| DE | 102006010963 A1 | 9/2007 |
| DE | 102013000270 A1 | 7/2014 |
| EP | 2615735 A2 | 7/2013 |
| WO | 2019/086701 A1 | 5/2019 |

OTHER PUBLICATIONS

Ortega, A., et al., "Speech reinforcement system for car cabin communications", IEEE Transactions on Speech and Audio Processing, vol. 13, Issue 5, Sep. 30, 2005, pp. 917-928.

Willems, D., et al., "Multifunction Chip set for T/R module receive path", IEEE Symposium on Microwave and Millimeter-Wave Monolithic Circuits, May 8, 1990, pp. 95-98.

CN First office action received for Application No. 201880064212. 2, dated Apr. 6, 2021, 13 pages (7 pages of English Translation and 6 pages of original office action)).

* cited by examiner

METHOD AND APPARATUS FOR AMPLIFYING RADIO SIGNALS BETWEEN A TERMINAL DEVICE AND AN ANTENNA

RELATED CASES

This application claims priority to PCT Application No. PCT/EP2018/080300 filed Nov. 6, 2018, which is incorporated herein by reference in its entirety and which claims priority to German Patent Application No. 102017219686.6, filed Nov. 6, 2017.

TECHNICAL FIELD

The present disclosure relates to a method for amplifying radio signals between a terminal device and an antenna and to a circuit arrangement for carrying out such a method.

BACKGROUND

With regard to radio signals transmitted and received by a radio device located in a motor vehicle, such as a mobile phone, a smartphone, a control device, or an emergency transmitter (hereinafter mobile radio device), the body of a motor vehicle acts as a "Faraday cage", that is to say, it blocks the radio signals. Transmitted and received signals of the mobile radio device are thereby attenuated, wherein even the use of the mobile radio device in the vehicle may no longer be possible in some circumstances.

It is therefore advantageous to couple the mobile radio device to an external antenna of the vehicle via a cable or an antenna structure during use in the vehicle in order to enable safe operation despite the blocking effect of the vehicle body on the one hand and to keep the radiation occurring during operation of the mobile radio device away from the interior of the vehicle on the other hand. For this purpose, a corresponding amplifier device has a plurality of individually switchable amplifier paths for amplifying radio signals in different frequency bands, which amplifier paths are usually used for uplink and downlink signal transmissions in mobile radio systems.

Mobile terminal devices, such as mobile phones or smartphones, typically support a variety of communication standards, such as Global System for Mobile Communications (GSM), Universal Mobile Telecommunications System (UMTS), Long Term Evolution (LTE), etc., which use different transmission methods and different frequency ranges. In order to be able to provide reliable operation when using different communication standards and/or different frequency ranges, a circuit arrangement for amplifying radio signals between a terminal device and an antenna must support these different standards and/or frequency ranges and must in particular be multiband-capable. For example, such a circuit arrangement must provide amplifiers specifically adapted to the different frequency ranges. However, since one or more activated amplifiers for a frequency range may interfere with the frequency range of one or more other amplifiers, it is customary to amplify only the frequency range currently used by the terminal device. On the other hand, the amplifiers of the currently unused frequency ranges are generally not activated in order to avoid mutual interference. "Not activated" means, for example, that the amplifying properties of the amplifier paths of the unused frequency ranges are reduced. Furthermore, deactivating amplifiers of the currently unused frequency ranges is advantageous in order, for example, to reduce the power consumption of the circuit arrangement.

Multi-band circuit arrangements for bidirectional amplifier systems are known which support either a combination of frequency division duplex (FDD) and time division duplex (TDD), such as GSM, or a pure FDD method, such as UMTS, CDMA2000, LTE FDD. A transmission of radio signals between a terminal device and an antenna in the receiving direction (hereinafter also RX or downlink) and transmitting direction (hereinafter also TX or uplink) takes place at different carrier frequencies. The presence of an uplink signal in a frequency band can be determined unambiguously under certain conditions by frequency selection and subsequent signal power detection. In order to be able to detect the required minimum desired TX signal levels and simultaneously suppress adjacent desired RX signal levels, a correspondingly high filtering effect of the individual detector branches in the circuit arrangement must be ensured. In the case of multiband-capable amplifier systems in particular, this leads to an increase in the complexity of the filter technologies to be used in the individual detector branches. In particular, the complexity increases with the number of bands supported.

Methods according to transmission standards in which the desired RX and TX frequency ranges are identical constitute a special case. An example of such methods are pure TDD methods, such as LTE TDD and TD SCDMA, in which solely TDD is used and in which radio signals are transmitted in a time-shifted manner in the same frequency range both in the receiving direction (RX) and in the transmitting direction (TX). Since a frequency-selective distinction between TX and RX signals is not possible and in particular the dynamic range of the TX and RX power levels overlap in such methods, TX and RX signals cannot be distinguished in the usual way in such methods.

Thus, improved methods for amplifying radio signals between a terminal device and an antenna as well as corresponding circuit arrangements for performing such a method, which methods and arrangements overcome the problems and disadvantages described above, are desirable. In particular, corresponding improved methods and circuit arrangements are desirable which enable multi-band detection and amplification of radio signals in a bidirectional time-division multiplex method with an identical transmission and reception frequency range and thus a determination of the direction of the radio signals.

Furthermore, corresponding improved methods and circuit arrangements are also desirable for frequency-division multiplex methods which in particular enable improved signal detection in the respective transmission and reception frequency bands.

SUMMARY

The object described above is achieved by the disclosure as defined in the independent claims. Advantageous embodiments are defined in the dependent claims.

Starting from the problems outlined above, the current disclosure is to provide a method for operating a circuit arrangement for amplifying radio signals between a terminal device and an antenna, wherein the circuit arrangement has an amplifying unit with at least one transmission amplifier path and at least one reception amplifier path. The method comprises detecting a signal power in a first frequency range in the transmitting direction from the point of view of the terminal device in order to determine a transmitted signal power and detecting a signal power in a second frequency range in the receiving direction from the point of view of the terminal device in order to determine a received signal power. The method further comprises comparing the detected transmitted signal power with the detected received signal power. If the detected transmitted signal power is stronger than the detected received signal power, the transmission amplifier path is activated to amplify transmitted signals in the first frequency range. If the detected received signal power is stronger than the detected transmitted signal power, the reception amplifier path is activated to amplify received signals in the second frequency range.

"Activating an amplifier path" means that the amplifier path is switched in such a way that it can amplify the signals of the corresponding band. The respective transmission amplifier or reception amplifier must accordingly be switched live. However, this does not mean that the respective amplifier must be switched to be currentless in states other than "activated."

Insofar as "comparison" of the detected transmitted signal power to the detected received signal power is referred to herein, such a comparison is not limited to directly comparing the signal powers detected by the detectors. Rather, this can also include applying a computation to the signal powers detected by the detectors, for example, taking into account that the detectors are placed behind corresponding amplifiers and/or taking into account values obtained during the calibration of the circuit arrangement. If, for example, the signal powers detected by the detectors are transmitted to a control unit in the form of DC voltage signals, comparison according to the disclosure also includes an initial application of correction factors to the output DC voltage signals representing the transmission and reception power detected by the transmitted signal power or received signal power detector, in order to ultimately decide whether or not the detected transmitted signal power is stronger than the detected received signal power.

The method described above enables detection of the direction of radio signals in bidirectional amplifier systems.

In an advantageous embodiment, if the detected received signal power is stronger than the detected transmitted signal power, the corresponding transmission amplifier path is additionally deactivated. In this way, mutual interferences of the transmission and reception amplifier paths are avoided and the power consumption of the circuit arrangement is reduced.

The case in which the detected received signal power is stronger than the detected transmitted signal power also includes the case in which no transmitted signal can be detected. If both the detected transmitted signal power and the detected received signal power are below a respective predefined threshold value and thus neither a transmitted signal nor a received signal can be detected, the reception amplifier path is likewise activated and the transmission amplifier path is additionally deactivated.

In a further advantageous embodiment, the first and second frequency ranges are identical. An example of such methods are pure TDD methods, such as LTE TDD and TD SCDMA, in which solely TDD is used and in which radio signals are transmitted in a time-shifted manner in the same frequency range both in the receiving direction (RX) and in the transmitting direction (TX). Another example is FDD methods in which transmission of radio signals between a terminal device and an antenna takes place in different frequency ranges, i.e., at different carrier frequencies, in the receiving direction and transmitting direction.

In a further advantageous embodiment, the second frequency range comprises a plurality of frequency ranges. For example, the transmitted signal power in the first frequency range may be compared to the received signal power of a plurality of reception frequency ranges.

In a further embodiment, detection in the transmitting direction (110) and detection in the receiving direction (120) take place substantially simultaneously. In this case, "substantially simultaneously" means that detection in the transmitting and receiving directions can also take place in quick temporal succession. The decisive factor here is that detection in the transmitting direction and detection in the receiving direction both take place in a time window which ensures that, for example, in the case of a TDD method, no switching from one transmitting direction to the other has taken place yet.

In another embodiment, the radio signals are sent in a time-division duplex (TDD) method. A frequency-selective distinction between TX and RX signals is not possible in such methods. By contrast, the method according to the disclosure permits detection of the direction of radio signals in bidirectional amplifier systems even in the case of TDD methods.

In another embodiment, detection in the transmitting direction takes place by means of a first coupling out of a portion of the signal power in the transmitting direction at a first coupling-out point and detection in the receiving direction takes place by means of a second coupling out of a portion of the signal power in the receiving direction at a second coupling-out point. The portions of the signal powers coupled out in this way can be routed to other elements of the circuit arrangement for further processing.

In a further embodiment, the first coupling out takes place by means of a coupler on the terminal device side which is connected upstream of a transmitted signal power detector, and the second coupling out takes place by means of a coupler on the antenna side which is connected upstream of a received signal power detector.

In another embodiment, the transmitted signal detector and the received signal detector are directionally decoupled from each other. This ensures that the transmitted signal power detector measures a higher power for a transmitted signal than the received signal power detector does, and vice versa, that the received signal power detector measures a higher power for a received signal than the transmitted signal power detector does. This also ensures that the sensitivity of the transmitted signal detection is high when a transmitted and a received signal are present at the same time, and a transmitted signal is therefore detected with greater sensitivity than a received signal. The greater the decoupling with respect to signal direction, the lower the transmitted signal levels that can be detected when a received signal is simultaneously present at the antenna unit. In other words, the desensitization of the transmitted signal detection caused by coexisting received signals at the antenna unit is reduced by decoupling the detectors as much as possible.

In another embodiment, the couplers upstream of the transmitted signal detector and the received signal detector respectively function as directional couplers with high directivity. This ensures that only a small portion of the respective signal power is coupled out in order not to attenuate the actual desired signal unnecessarily.

In a further embodiment, the directional decoupling is increased by signal attenuation between the coupling-out points in order to achieve even better decoupling of the detectors.

In another embodiment, at least one bandpass filter is connected between the coupler on the terminal device side and the transmitted signal power detector as well as between the coupler on the antenna side and the received signal power detector.

In another embodiment, the coupled-out portion of the signal power in the transmitting direction is routed to the transmitted signal power detector and the coupled-out portion of the signal power in the receiving direction is routed to the received signal power detector. The transmitted signal power detector and the received signal power detector each generate, based on the coupled-out portions, a DC voltage signal which is routed to a control unit in each case.

In a further embodiment, the method further comprises evaluation of the DC voltage signals by the control unit. Based on a result of the evaluation, the control unit activates the respective transmission and/or reception amplifier paths. In this way, the respective amplifier path is activated depending on the detected signal direction. If the detected transmitted signal is an FDD transmitted signal, the corresponding FDD reception amplifier path is also activated simultaneously with the respective FDD transmission amplifier path.

In another embodiment, the method further comprises supplying the radio signals to a frequency separator, a power splitter, or a high-frequency switch in order to direct the supplied radio signal into the transmission amplifier path or into the reception amplifier path.

In a further embodiment, the transmission amplifier path has at least one transmission amplifier and/or the reception amplifier path has at least one reception amplifier.

In order to achieve the aforementioned goal, the present disclosure moreover provides a corresponding circuit arrangement for amplifying radio signals between a terminal device and an antenna. The device comprises means for carrying out the method described above.

Both the above general description and the detailed description are to be considered as an example and are to be used for explaining the disclosure claimed. Other advantages and features of the disclosure are apparent from the following description, drawings, and claims.

BRIEF DESCRIPTION OF THE DRAWINGS

The features of the disclosure are explained in more detail in the appended claims. The disclosure itself, however, is best understood by reference to the following detailed description, which describes an exemplary embodiment of the disclosure with reference to the drawings. In the drawings:

DETAILED DESCRIPTION OF THE PREFERRED EMBODIMENTS

The accompanying drawings, the technical content and the detailed description relate to a preferred embodiment of the disclosure, which is however not to be considered as a limitation of the subject matter of the disclosure. All equivalent variations and changes made in accordance with the appended claims of the present disclosure are covered by these claims.

Hereinafter, the disclosure is described in detail with reference to the drawings.

Figure 1:
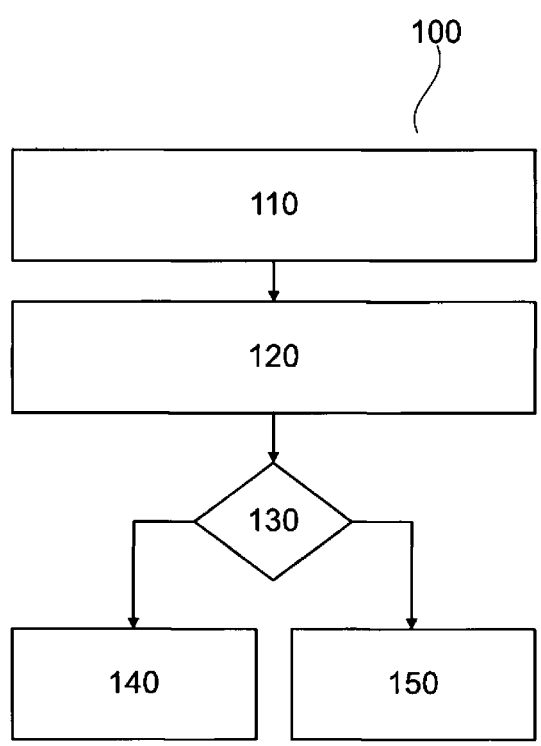
FIG. 1 shows a flow chart of a method for operating a circuit arrangement for amplifying radio signals between a terminal device and an antenna according to one embodiment of the disclosure.
Figure 2:
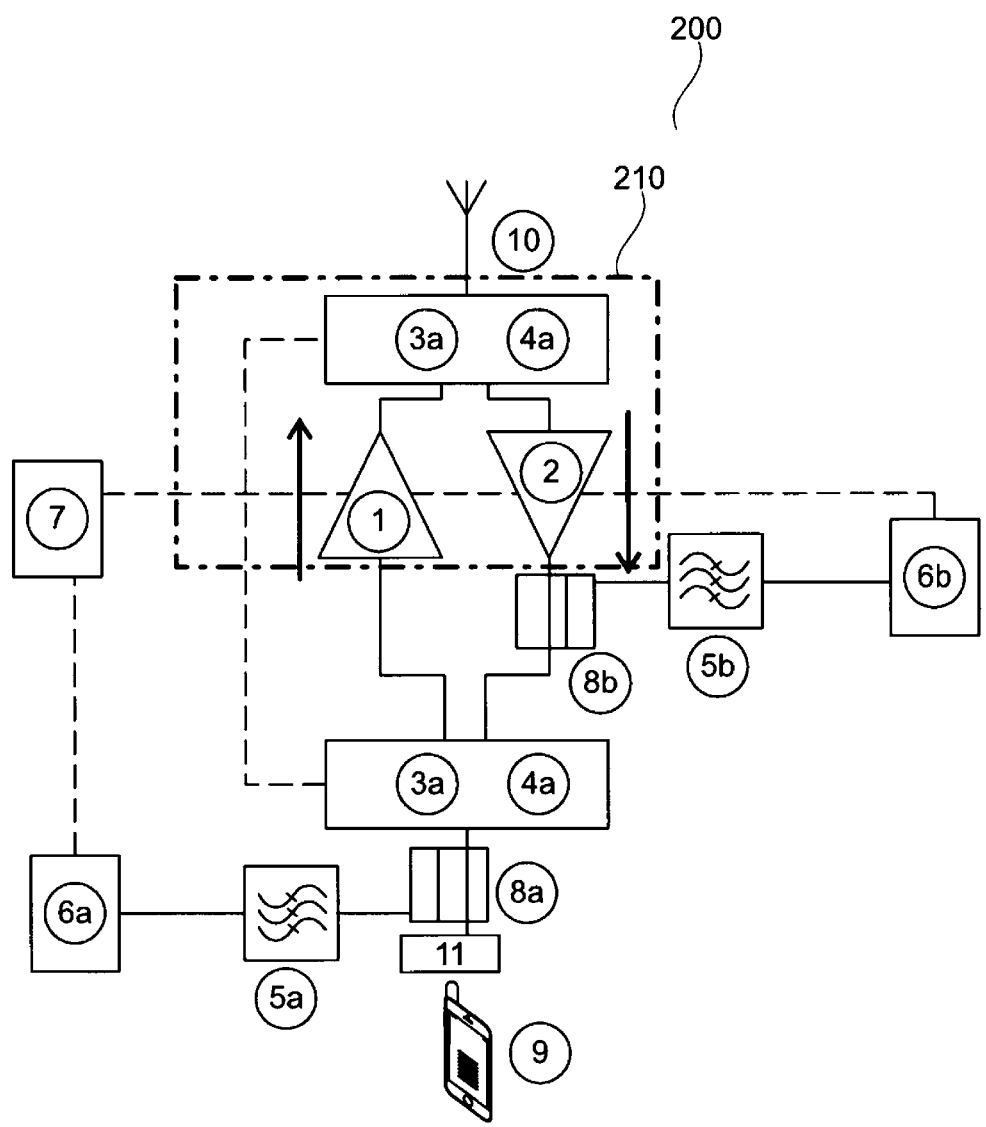
FIG. 2 shows a circuit arrangement for amplifying radio signals between a terminal device and an antenna according to one embodiment of the disclosure.

FIG. 1 shows a flow chart of a method 100 for operating a circuit arrangement 200 for amplifying radio signals between a terminal device 9 and an antenna 10 according to one embodiment of the disclosure. The corresponding circuit arrangement 200 is shown in FIG. 2 and comprises an amplifying unit 210 having a transmission amplifier path and a reception amplifier path. The circuit arrangement 200 will be described in detail below. The method 100 comprises detection 110 of a signal power in a first frequency range in order to determine a transmitted signal power. From the point of view of the terminal device 9, the signal power is in the transmitting direction (see FIG. 2). The method 100 furthermore comprises detection 120 of a signal power in a second frequency range in order to determine a received signal power. From the point of view of the terminal device 9, the received signal power is in the receiving direction.

As described in the introduction, the method according to the disclosure is particularly advantageous when the first and the second frequency range are identical, that is to say, in the case of methods according to transmission standards in which the desired RX and TX frequency ranges are identical. An example of such methods are pure TDD methods, such as LTE TDD and TD SCDMA, in which solely TDD is used and in which radio signals in both the receiving direction (RX) and the transmitting direction (TX) occur in a time-shifted manner in the same frequency range. For reliable determination of the direction of radio signals when using a time-division duplex method, it is furthermore advantageous for detection in the transmitting direction 110 and detection in the receiving direction 120 to take place substantially simultaneously. As explained above, "substantially simultaneously" here means that the detection in the transmitting and receiving directions can also take place in quick temporal succession. The decisive factor here is that detection in the transmitting direction and detection in the receiving direction both take place in a time window which ensures that, for example, in the case of a TDD method, no switching from one transmitting direction to the other has taken place yet. Detection does not have to take place simultaneously in the transmitting and receiving direction, as long as it is ensured that detection of the direction and the corresponding switching of the amplifier paths take place within the turn-on time of the HF signal, which does not yet contain any information relevant to the communication. Simultaneous processing by the detectors offers the advantage of faster processing of received and/or transmitted signals, among other things. Furthermore, possible amplitude fluctuations in the detectors can be directly compared with one another by modulating the signals from both detectors.

After detecting and determining 110, 120 the respective transmitted and received signal powers, a comparison 130 of the detected transmitted signal power to the detected received signal power takes place. Step 130 of the method 100 is a distinction between cases. If the comparison 130 indicates that the detected transmitted signal power is stronger than the detected received signal power, the transmission amplifier path is activated 140 in order to amplify transmitted signals in the first frequency range in the circuit arrangement 200. If, on the other hand, the received signal power is stronger than the transmitted signal power, the reception amplifier path is activated 150 in order to amplify received signals in the second frequency range in the circuit arrangement 200. As stated above, the case in which the detected received signal power is stronger than the detected transmitted signal power also includes the case in which no transmitted signal can be detected. If both the detected transmitted signal power and the detected received signal power are below a respective predefined threshold value and thus neither a transmitted signal nor a received signal can be detected, the reception amplifier path is likewise activated and the transmission amplifier path is additionally deactivated.

In addition to or as an alternative to the described comparison 130 of the detected transmitted signal power to the detected received signal power, after detection of a transmitted signal at the transmitted signal power detector 6a, the reception path in the circuit arrangement can be interrupted or deactivated in order to subsequently detect the presence of a transmitted signal originating from the terminal device 9 by means of repeated signal level measurement at the transmitted signal power detector 6a. If the detected signal originated from the antenna, no signal power level would be detectable at the transmitted signal power detector 6a any longer after interruption or deactivation of the reception path. This method has the advantage that an interfering signal on the receiving side can be kept away from the transmitted power signal detector 6a. However, this method has the disadvantage that the reception path is interrupted and, under certain circumstances, desired received signals are not relayed to the terminal device in amplified form.

If the transmitted signal is a TDD signal, the TDD reception amplifier path is deactivated simultaneously with the activation of the TDD transmission amplifier.

If the transmitted signal is an FDD signal, the FDD reception amplifier path is activated simultaneously with the activation of the FDD transmission amplifier. In this way, in the case of FDD, overcoupling of received signals into the transmission detector path can be detected, for example, based on the detection of direction according to the disclosure and an FDD received signal can thus be prevented from being incorrectly interpreted as an FDD transmitted signal.

The respective signal powers in the transmitting and receiving direction 110, 120 are preferably detected by means of a coupling out in each case of a portion of the signal power in the transmitting direction or receiving direction. This takes place on the part of the terminal device 9 by means of a coupler 8a on the terminal device side as the first coupling-out point, which is connected upstream of a transmitted signal power detector 6a. Correspondingly, the coupling out on the part of the antenna takes place by means of a coupler 8b on the antenna side as the second coupling-out point, which is also connected upstream of a received signal power detector 6b. The couplers 8a and 8b can also be arranged at other points in the circuit arrangement 200 as long as the coupler 8a acting in the receiving direction is located in the reception path and the coupler 8b acting in the transmitting direction is located in the transmission path. That is to say, the coupler 8a acting in the receiving direction must be arranged in such a way that the received signal passes through and a portion of it can be coupled out by the coupler 8a, and the coupler 8b acting in the transmitting direction must be arranged in such a way that the transmitted signal passes through and a portion of it can be coupled out by the coupler 8b. In particular, it is also possible to place one or both of the couplers 8a, 8b behind a corresponding amplifier.

In order to ensure reliable determination of the direction of the radio signals, the transmitted signal power detector 6a and the received signal power detector 6b are preferably implemented in a manner directionally decoupled from each other. In advantageous embodiments, this is achieved, for example, in that the couplers 8a, 8b upstream of the transmitted signal detector 6a and the received signal detector 6b are each designed as directional couplers with high directivity.

Instead of using the directional couplers 8a, 8b, it is also possible, for example, to use splitters for splitting the transmitted and received signals. The statements made above about the couplers 8a, 8b also apply to splitters, in particular the statements concerning placement in the circuit arrangement.

The activation 140, 150 of the respective amplifier path, that is to say, the transmission amplifier path or the reception amplifier path, depending on whether the transmitted signal power or the received signal power is stronger (i.e., has a higher signal level), is controlled by a control unit 7. To this end, the coupled-out portion of the signal power in the transmitting direction is routed to the transmitted signal power detector 6a and the coupled-out portion of the signal power in the receiving direction is routed to the received signal power detector 6b. The transmitted signal power detector 6a and the received signal power detector 6b respectively generate, based on the coupled-out portions, a DC voltage signal proportional to the respective signal power. These DC voltage signals are routed to the control unit 7. The control unit 7 evaluates the DC voltage signals routed to it. The evaluation is preferably carried out using a calculation rule which is parameterized, for example, by calibration data recorded during the production of the circuit arrangement 200. Based on a result of this evaluation, the control unit 7 correspondingly activates the respective transmission and/or reception amplifier path.

Thus, if a TDD transmitted signal is detected, the TDD transmission amplifier path is activated; correspondingly, if a TDD received signal is detected, at least the TDD reception amplifier path is activated and the TDD transmission amplifier path is deactivated.

If an FDD transmitted signal is detected, both the FDD transmission amplifier path and the FDD reception amplifier path are activated.

While the method according to the disclosure is particularly advantageous for transmissions according to a TDD method, it can also be used, as described above, for transmissions according to an FDD method or for a combination of transmissions according to TDD and FDD methods as in the case of GSM. In the case of FDD methods, it is, for example, possible to use simpler frequency filters with a lower frequency selectivity. The method according to the disclosure makes it possible to compensate for this lower frequency selectivity of the filters by enabling the direction of the signals to also be determined in FDD methods.

A further advantage of the method according to the disclosure is that the method and the corresponding circuit arrangement are robust to signals which may be present at the antenna unit 10, for example, to signals received from one or more base stations and to signals transmitted by other terminal devices located in the vicinity.

For example, another terminal device outside a vehicle in which the circuit arrangement according to the disclosure is installed transmits a radio signal, wherein the other terminal device is located in the vicinity of the antenna unit 10. The signal transmitted by the other terminal device acts as an interfering signal at the antenna unit 10. The method according to the disclosure can detect the interfering signal by detecting the direction according to the disclosure.

In another scenario, a base station transmits in E-UTRA band 3 (FDD) in the downlink. The reception frequency range of E-UTRA band 3 is adjacent to E-UTRA band 39 (TDD). By means of the detection of direction according to the disclosure, the interfering base station signal can be detected and is thus in particular not detected as a signal transmitted by the terminal device 9 in band 39.

In another scenario, another terminal device or base station located near the antenna unit 10 transmits in E-UTRA band 7 (FDD uplink or downlink). E-UTRA band 7 overlaps with E-UTRA band 41 (TDD). Erroneous detection of a transmitted signal in E-UTRA band 41 is prevented by the detection of direction according to the disclosure.

In summary, the detection of direction according to the disclosure thus makes it possible to detect interference of a frequency in other (especially adjacent) bands. As stated above, this is particularly advantageous for the case of closely spaced or overlapping bands in the frequency spectrum.

FIG. 2 shows a circuit arrangement 200 for amplifying radio signals between a terminal device 9 and an antenna 10, comprising means for carrying out the method described above. FIG. 2 shows the above-mentioned couplers 8a, 8b on the terminal device side and on the antenna side as well as the frequency separators 3a and high-frequency switches 4a coupled to the couplers 8a, 8b. Power splitters can be used instead of or in addition to frequency separators or high-frequency switches. A transmitted signal coming from the terminal device 9 is routed via the coupler 8a (or a corresponding splitter) into the transmission amplifier path to the antenna 10 and thus through the transmission amplifier 1, while a received signal coming from the antenna 10 is routed via the reception amplifier path to the terminal device 9 and thus through the reception amplifier 2. Transmission and reception amplifiers 1 and 2 are combined in FIG. 2 as amplifying unit 210. A high-frequency filter 5a, 5b is respectively arranged between the couplers 8a, 8b (or the corresponding splitters) and the corresponding transmitted and received signal power detectors 6a, 6b, said filter serving to filter the coupled-out portions of the signal according to the frequency range to be determined. The control unit 7, which is adapted for controlling (i.e., activating and deactivating) the transmission and reception amplifier paths, is coupled to the transmitted signal power detector 6a and the received signal power detector 6b. The radio signals coming from the terminal device 9 and/or the antenna 10 are preferably routed to a frequency separator 3, a power splitter (coupler), or a high-frequency switch 4 in order to in this way route the supplied radio signal into the transmission amplifier path or into the reception amplifier path. The transmission amplifier path has at least one transmission amplifier 1, and the reception amplifier path correspondingly has at least one reception amplifier 2.

Preferably with the aid of a transmission unit 11, the circuit arrangement 200 receives the signals transmitted by the terminal device 9 for further wire-based processing by the circuit arrangement 200, and transmits the received signals of the antenna 10 to the terminal device 9 after further processing by the circuit arrangement 200. However, the transmission unit 11 is not necessarily part of the circuit arrangement. In the transmitted signal direction, the transmission unit 11 is followed by the coupler 8a, which serves to divide the signal transmitted by the terminal device 9 into (at least) a first signal portion and a second signal portion, and routes the first signal portion to the transmitted signal power detector 6a and the second signal portion to the amplifying unit 210.

As shown in FIG. 2, the transmitted signal power detector 6a can receive transmitted signals before they pass through a transmission power amplifier, while the received signal power detector 6b receives signals after they have passed through a reception power amplifier. However, this arrangement can be modified in many ways: For example, a signal amplifier could also be connected upstream of the transmitted signal power detector 6a, or the received signal power detector 6b could receive received signals before they pass through a reception power amplifier. In the latter case, a separate preamplifier could also be connected upstream of the received signal power detector 6b. The advantage of only placing the received signal power detector 6b after the reception power amplifier 2 as shown in FIG. 2 is that a preamplifier can be omitted and the received signal power detector can be designed with lower sensitivity.

Figure 3:
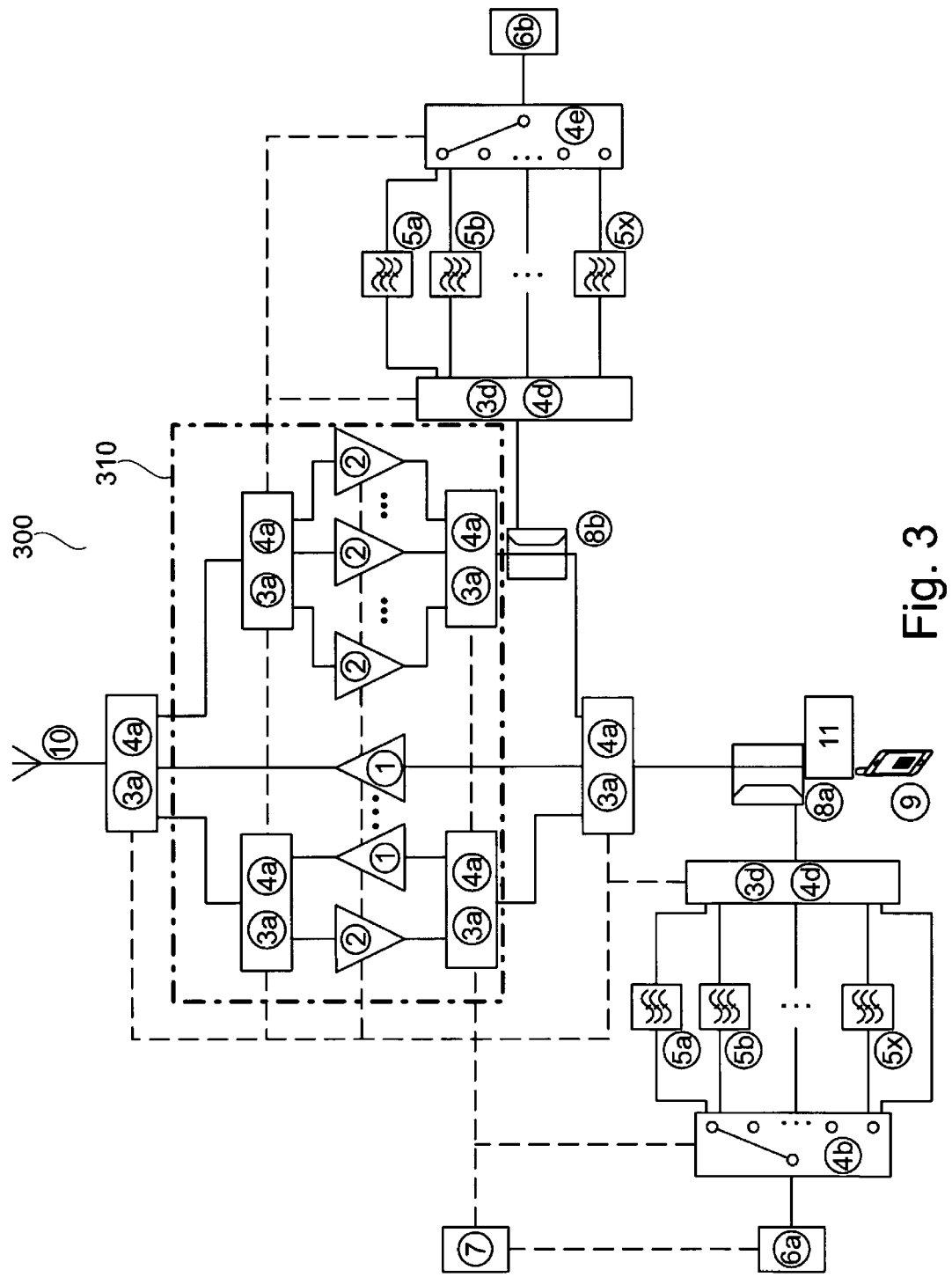
FIG. 3 shows a circuit arrangement for amplifying radio signals between a terminal device and an antenna according to another embodiment of the disclosure.

FIG. 3 shows a circuit arrangement 300 for amplifying radio signals between a terminal device 9 and an antenna 10 according to another embodiment of the disclosure. In particular, the circuit arrangement 300 shown in FIG. 3 represents an extension of the circuit arrangement 200 shown in FIG. 2 to a multi-band amplifier system.

Because of the extension to a multi-band amplifier system, circuit 300 correspondingly has a plurality of amplifier paths which are combined in FIG. 3 as amplifying unit 310. In this case, at least one transmission amplifier path and one reception amplifier path are respectively provided for each frequency band to be supported by the circuit arrangement 300. Depending on whether a half-duplex or a full-duplex method is to be supported in a particular frequency band, the transmission and reception amplifier paths for each frequency band are switchable (i.e., can be activated/deactivated) simultaneously or in parallel or independently of one another. Instead of only one high-frequency filter 5a as shown in the circuit arrangement 200 of FIG. 2, a plurality of high-frequency filters 5a, 5b, . . . , 5x are placed in the circuit arrangement 300 of FIG. 3 between the couplers 8a, 8b and the corresponding transmitted or received signal power detectors 6a, 6b, wherein each of the high-frequency filters 5a, 5b, . . . , 5x serves to filter the coupled-out portions of the signals according to the frequency ranges to be determined which are supported by the multi-band amplifier system. In addition, the circuit arrangement 300 has additional frequency separators 3c, 3d and/or additional high-frequency switches 4c, 4d, which are in each case arranged between the couplers 8a, 8b and the plurality of high-frequency filters 5a, 5b, . . . , 5x and route the coupled-out portions of the transmitted and received signals to the high-frequency filters 5a, 5b, 5x. A corresponding high-frequency switch 4b, 4e is coupled between the transmitted and received signal power detectors 6a, 6b in each case and routes the respective signal filtered by the high-frequency filters 5a, 5b, . . . , 5x to the transmitted and received signal power detectors 6a, 6b. In this case, the high-frequency switches 4b, 4e are preferably connected in parallel (i.e., simultaneously in the same way) in order to ensure that the same frequency range is detected in both detectors 6a, 6b in each case.

It is also possible to use frequency separators or power splitters as an alternative to the use of high-frequency switches 4b, 4e. This is not shown in FIG. 3.

The couplers or power splitters 8a and 8b can alternatively be placed at other locations in the circuit arrangement 200, 300, as long as care is taken that the coupler 8a on the transmitted signal side is at least in the transmission path and the coupler 8b on the received signal side is at least in the reception path and both detectors 6a and 6b are directionally decoupled from one another. In particular, the statements made with respect to FIG. 2 concerning placement before or after corresponding amplifiers also apply to the embodiment shown in FIG. 3.

Figure 5:
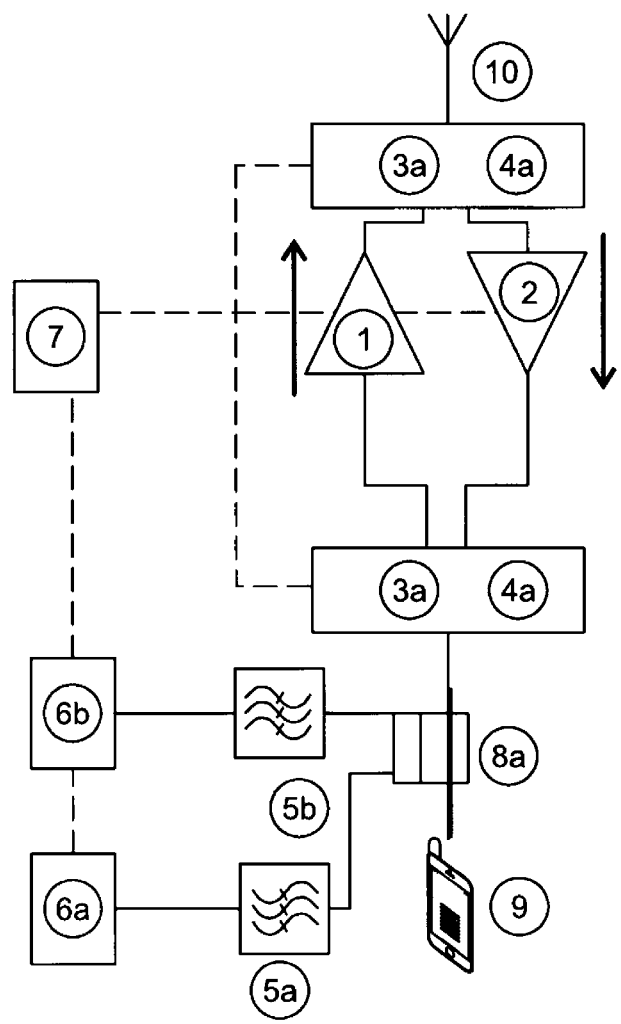
FIG. 5 shows a circuit arrangement for amplifying radio signals between a terminal device and an antenna according to another embodiment of the disclosure.

In further embodiments of the circuit arrangement, only one coupler is provided. A corresponding circuit arrangement is shown in FIG. 5. There, a coupler 8a is installed on the terminal device side. The transmission unit 11 provided between the terminal device 9 and the coupler 8a is not shown in FIG. 5 for the sake of clarity. The detector paths 5a and 5b can alternatively be brought together to a single detector 6 by a high-frequency switch. In this case, depending on the position of the switch, the detector 6 takes over either the function of the transmitted signal power detector 6a or, in another switch position, the function of the received signal power detector 6b. It is also possible to place the coupler on the antenna side, for example, before the frequency separator(s) 3a shown above and the high-frequency switch(es) 4a when viewed in the receiving direction.

In the circuit arrangement 300 as shown in FIG. 3, a control unit 7 is also coupled to the transmitted and received signal power detectors 6a, 6b which is equipped to evaluate the coupled-out portions of the signals routed to it and to control (i.e., to activate/deactivate) corresponding transmission amplifier paths and/or reception amplifier paths of the amplifying unit 310 based on a result of this evaluation.

The circuit arrangement 300 shown in FIG. 3 makes it possible to also use the present disclosure in multi-standard amplifier systems supporting multiple radio standards, such as TDD and FDD systems as well as mixed forms of TDD and FDD.

As an alternative or in addition to an implementation of directional decoupling by means of directional couplers, as described above, directional decoupling in some embodiments is achieved by increasing signal attenuation between the coupling-out points (in the embodiments illustrated above, these points are the couplers 8a, 8b). By increasing the directional decoupling of the detectors 6a, 6b, desensitization of transmitted signal detection at the transmitted signal power detector 6a as caused by a simultaneous interfering signal at the antenna unit 10 can be reduced.

Figure 4:
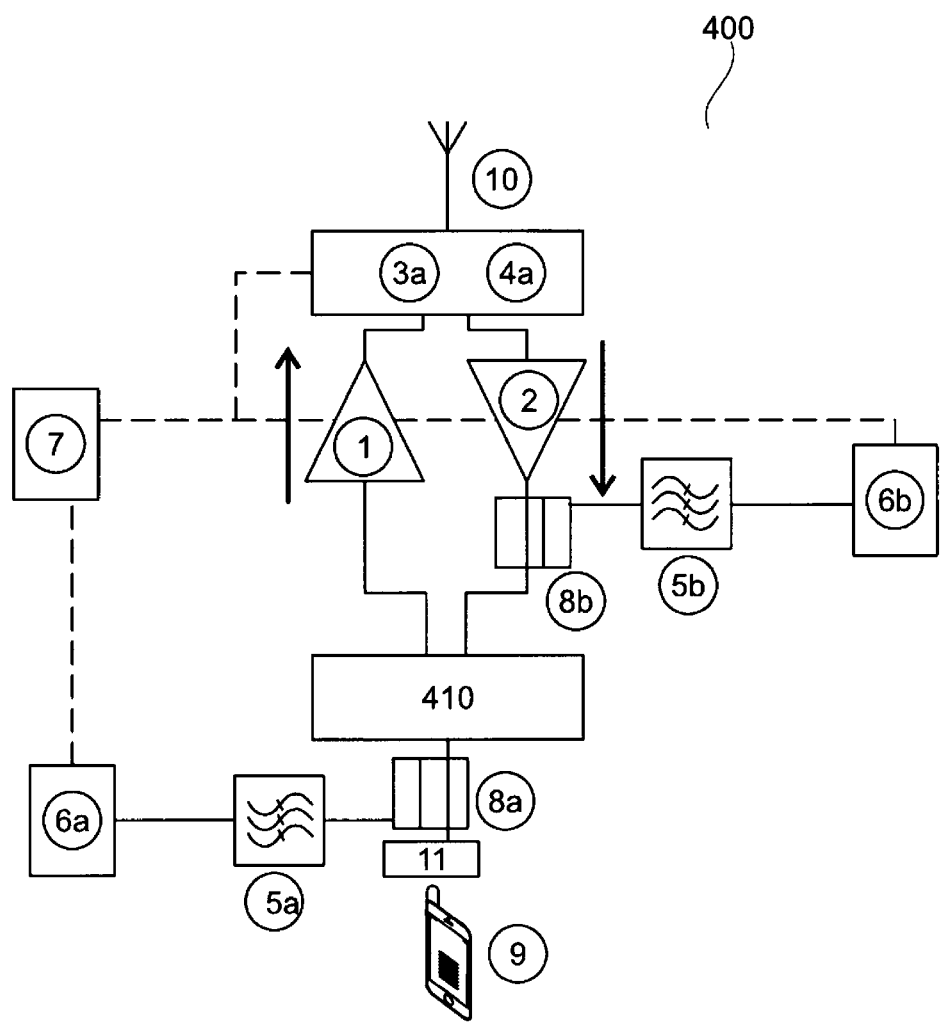
FIG. 4 shows a circuit arrangement for amplifying radio signals between a terminal device and an antenna according to another embodiment of the disclosure.

FIG. 4 shows a corresponding embodiment of the circuit arrangement. The circuit arrangement 400 substantially corresponds to the circuit arrangement 200 from FIG. 2. In contrast to the circuit arrangement 200 of FIG. 2, however, the circuit arrangement 400 of FIG. 4 has a signal attenuating element 410 in addition to the frequency separators 3a or high-frequency switches 4a arranged on the terminal device side, which signal attenuating element 410 increases the above-mentioned signal attenuation between the couplers 8a, 8b. The signal attenuating element 410 may be designed in various ways. The signal attenuating element 410 may be designed, for example, as a combination of an attenuator and a power splitter (splitter, coupler). Instead of a splitter, a switch in combination with an attenuator can also be used. Additional combinations are possible.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:

1. A method for operating a circuit arrangement for amplifying radio signals between a terminal device and an antenna, wherein the circuit arrangement comprises an amplifying unit having at least one transmission amplifier path and at least one reception amplifier path, the method comprising:

detecting a signal power in the transmitting direction, from the point of view of the terminal device, in a first frequency range in order to determine a transmitted signal power;

detecting a signal power in the receiving direction, from the point of view of the terminal device, in a second frequency range in order to determine a received signal power;

comparing the detected transmitted signal power to the detected received signal power;

if the detected transmitted signal power is stronger than the detected received signal power, activating the transmission amplifier path in order to amplify transmitted signals in the first frequency range; and if the detected received signal power is stronger than the detected transmitted signal power, activating the reception amplifier path in order to amplify received signals in the second frequency range;

wherein the first and second frequency ranges in which the radio signals are transmitted in the transmitting and receiving direction are identical, and wherein detecting in the transmitting direction and detecting in the receiving direction take place in a time window which ensures that, according to the specifications of the transmission standard of the radio signal, no switching from one transmitting direction to the other transmitting direction has taken place yet.

2. The method of claim 1, wherein if the detected received signal power is stronger than the detected transmitted signal power, the transmission amplifier path for amplifying transmitted signals in the first frequency range is additionally deactivated.

3. The method of claim 1, wherein the radio signals are transmitted according to a time-division duplex (TDD) method.

4. The method of claim 1, wherein detecting in the transmitting direction takes place by means of a first coupling out of a portion of the signal power in the transmitting direction at a first coupling-out point and wherein detecting in the receiving direction takes place by means of a second coupling out of a portion of the signal power in the receiving direction at a second coupling-out point.

5. The method of claim 4, wherein the first coupling out takes place by means of a coupler on the terminal device side, which is connected upstream of a transmitted signal power detector, and wherein the second coupling out takes place by means of a coupler on the antenna side, which is connected upstream of a received signal power detector.

6. The method of claim 5, wherein the transmitted signal power detector and the received signal power detector are directionally decoupled from each other.

7. The method of claim 6, wherein the couplers connected upstream of the transmitted signal power detector and the received signal power detector each function as directional couplers with high directivity.

8. The method of claim 7, wherein the directional decoupling is increased by signal attenuation between the coupling-out points.

9. The method of claim 8, wherein at least one bandpass filter is connected in each case between the coupler on the terminal device side and the transmitted signal power detector as well as between the coupler on the antenna side and the received signal power detector.

10. The method of claim 9, wherein the coupled-out portion of the signal power in the transmitting direction is routed to the transmitted signal power detector and the coupled-out portion of the signal power in the receiving direction is routed to the received signal power detector, and wherein the transmitted signal power detector and the received signal power detector each generate, based on the coupled-out portions, a DC voltage signal which is routed to a control unit in each case.

11. The method of claim 10, wherein the method further comprises:
   evaluating the DC voltage signals with the control unit;
      wherein the control unit activates the respective transmission and/or reception amplifier paths based on the evaluation.

12. The method of claim 11, wherein the method further comprises routing the radio signals to a frequency separator, a power splitter, or a high-frequency switch in order to route the supplied radio signal into the transmission amplifier path or into the reception amplifier path.

13. The method of claim 12, wherein the transmission amplifier path has at least one transmission amplifier.

\* \* \* \* \*